Nov. 21, 1972 J. J. BAKEWELL 3,703,450

METHOD OF MAKING PRECISION CONDUCTIVE MESH PATTERNS

Filed April 1, 1971

INVENTOR
JOSEPH J. BAKEWELL
BY
Weingarten, Maxham & Schurgin
ATTORNEYS

United States Patent Office 3,703,450
Patented Nov. 21, 1972

3,703,450

METHOD OF MAKING PRECISION CONDUCTIVE MESH PATTERNS

Joseph J. Bakewell, Boxford, Mass., assignor to Dynamics Research Corporation, Wilmington, Mass.

Filed Apr. 1, 1971, Ser. No. 130,238
Int. Cl. C23b *7/00*; B01k *1/00*
U.S. Cl. 204—11 4 Claims

ABSTRACT OF THE DISCLOSURE

A method of fabricating precision conductive mesh patterns on a repetitively usable master plate. The master plate comprises a conductive pattern formed on a non-conductive light transmissive substrate and a non-conductive pattern formed in the interstices of the conductive pattern. A reproduction of the master pattern is formed by uniform plating of a conductive pattern onto the master pattern within a matrix defined by the non-conductive pattern. The plated replica of the master pattern is then peeled from the master plate and mounted in a suitable frame for use.

FIELD OF THE INVENTION

This invention relates to electroforming techniques and more particularly to a method of fabricating precision conductive mesh patterns.

BACKGROUND OF THE INVENTION

Precision mesh patterns are often employed in image tubes and in optical systems for providing controlled energy transmission. In general such mesh has heretofore been fabricated by one of two techniques. In one well known technique, a master pattern is provided by photolithography on a conductive substrate. The master pattern is then plated to form a reproduction thereof which is removed from the master to provide the intended mesh pattern. By reason of inherent limitations of the photolithography process there are serious limitations to the width and uniformity of the lines comprising the mesh pattern. The minimum width which can be developed in a photoresist coating is a function of the coating thickness; the thinner the coating the narrower the minimum achievable width. Thus to achieve fine line patterns by a photolithography technique, extremely thin photoresist layers must be employed which limit the resulting plated pattern thickness that can be formed.

According to another known technique for forming mesh patterns, a master pattern of lines is etched or ruled into a glass substrate and these lines are filled with a conductive material to serve as a conductive master pattern on which a plated mesh is formed. Again, there is a limitation to the fineness with which lines can be etched in glass which limits the resulting width of line patterns plated therefrom. A major disadvantage of both conventional techniques outlined above, is that reprocessing of the master pattern is required after production of a single or a relatively few plated reproductions. The additional labor involved in refabricating the master pattern materially adds to the cost of fine mesh. Moreover, the line edges are difficult to control either by means of etching into glass or by photolithography, with consequent limitation in the uniformity and precision of the lines plated onto the master pattern.

SUMMARY OF THE INVENTION

In accordance with the present invention, a precision conductive mesh pattern is formed which is both physically rugged and of accurate and uniform energy transmission characteristics. Briefly, the novel process comprises forming a master plate having a conductive mesh pattern on a surface of a non-conductive light transmissive substrate, which typically is glass, with a non-conductive pattern of relatively large thickness formed in the interstices of the master conductive pattern to serve as a matrix for later plating onto the master pattern. The nonconductive pattern is accurately formed by use of a photoresist pattern provided in exact registration with the master pattern by means of exposure through the opposite surface of the substrate to that on which the conductive pattern is formed. The master pattern also includes a conductive border having a plurality of electrical leads affixed around the periphery thereof to provide means for achieving a uniform plating current distribution. A replica of the master pattern is provided by electroplating onto the master pattern within the matrix defined by the nonconductive pattern. After deposition of the plated replica to a desired thickness, the replica can be peeled off the master pattern and suitably mounted for use. The master plate can be readily reused for producing a large number of like conductive patterns without material reprocessing of the master.

DESCRIPTION OF THE DRAWINGS

The invention will be more fully understood from the following detailed description taken in conjunction with the accompanying drawings, in which.

DETAILED DESCRIPTION OF THE INVENTION

As an initial step for practice of the novel process it is necessary to provide a master pattern on which the fine mesh pattern is formed. A metal grid pattern is formed on the surface of a glass plate, the pattern being in electrical connection with a conductive border formed therearound. Typically, the metal master pattern is evaporated onto the surface through a ruled pattern formed on a stencil material. The metal pattern should be of a metal such as chromium which forms a durable layer intimately adhered to the glass surface and immune to chemicals employed in subsequent processing. As will be further described, the use of a conductive border surrounding the master pattern assures uniform plating of a reproduced mesh pattern thereon.

Figure 1:
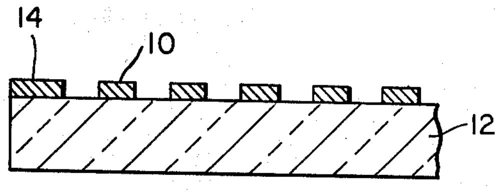
FIGS. 1 through 6 are greatly enlarged sectional elevation views illustrating the several steps of the novel process.
Figure 2:
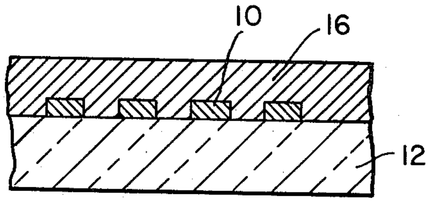

The production of the fine mesh pattern on the master plate according to the invention is best described in conjunction with FIGS. 1 through 6 which depict the several stages of the process in greatly enlarged sectional elevation view. Referring to FIG. 1 and to FIG. 7 which depicts the master plate, a master pattern 10 is seen formed on a surface of a glass plate 12 together with conductive border 14. A photoresist material 16 is formed over the metal pattern (FIG. 2) and the metal pattern and photoresist layer are exposed through the surface of the glass plate 12 opposite the metal pattern 10. It is a particular feature of the invention that exposure of the photoresist layer is accomplished from the opposite surface of the glass plate, the metal pattern serving essentially as its own mask to provide exact registration between the metal pattern and the non-posed photoresist material.

Figure 3:
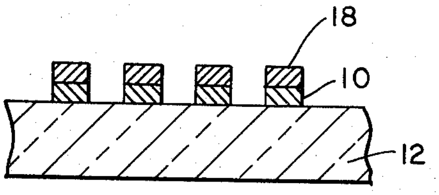
Figure 4:
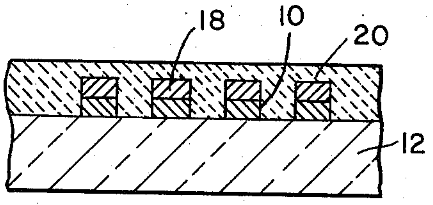
Figure 5:
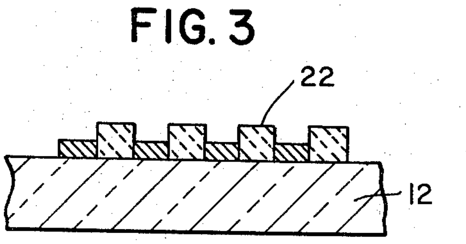

As seen in FIG. 3 the photoresist layer 16 is developed by well known means to form a resist pattern 18 over and in exact conformance with the metal matrix pattern 10 and the associated conductive border 14. A silicon monoxide layer 20 (FIG. 4) next formed over the surface of the glass plate 12 and over the photoresist pattern 18 now formed over the master matrix and associated border. The photoresist pattern 18 residing on the master matrix 10 is next removed (FIG. 5), for example by an acetone bath, along with any residual portions of the silicon monoxide layer 20 which are present above the photoresist areas. At this stage of the process an array of silicon monoxide pedestals 22 of relatively large thickness have been provided in the interstices defined by the matrix master pattern and serve to accurately define a pattern into which metal is electroplated.

Figure 7:
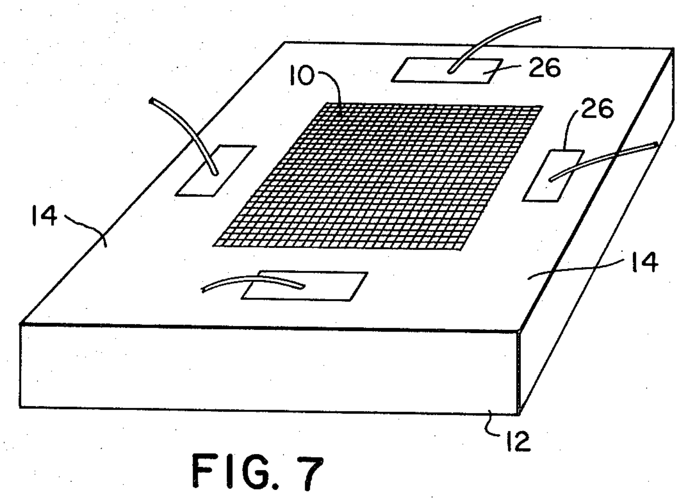
FIG. 7 is a pictorial view of a master plate embodying the invention.
Figure 8:
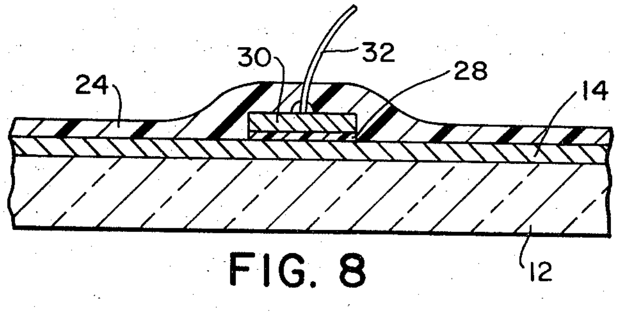
FIG. 8 is a greatly enlarged sectional elevational view of an electrical lead assembly useful in practicing the invention.

A plurality of conductive leads are next applied about the periphery of the conductive border 14 to serve as electrical leads for application of current uniformly to the master matrix. A typical lead arrangement is illustrated in FIG. 7 which shows four conductive leads 26 affixed at the center of each side of the conductive border 14 formed on the surface of glass plate 12. The electrical leads are typically affixed to the conductive border as shown in FIG. 8. A conductive epoxy cement 28 is applied to the area of the border 14 to which the lead pad is to be affixed. A copper or other suitably conductive pad 30 is affixed to the conductive epoxy 28 and a lead wire 32 is soldered or otherwise electrically connected to the surface of the copper pad. A plating mask 24 is then provided around the conductive border and over the lead assemblies, as illustrated in FIG. 8, to mask the leads and border portions from the metal to be evaporated over the master matrix.

Figure 6:
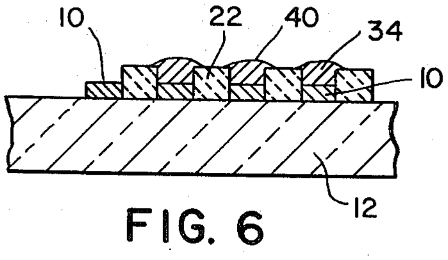

The master plate is immersed in an electroplating bath and an electrical connection is made from a suitable electrical energy source to the plurality of leads 32 provided around the periphery of conductive border 14. Plating current is uniformly applied via the plurality of leads to the conductive master pattern. As depicted in FIG. 6, a metal 34, typically nickel, is plated onto master matrix 10 in exact registration therewith as defined by the insulative pedestals 22 of silicon dioxide formed in the interstices of the master pattern. Since by virtue of the invention the pedestals 22 have been formed to a relatively large thickness, the plated pattern 34 can be formed to a similar thickness which is substantially greater than the thickness usually achieved by conventional processes for the same transmission.

The plate pattern 34 is usually deposited to the height of non-conductive pattern 22, or can be deposited to a substantially greater height forming a dome-shaped surface above the surface of pattern 22 as illustrated. Typically, the master conductive pattern 10 is formed to a thickness of 5 microinches. The non-conductive pattern 22 is formed to a thickness of about 40 microinches, while the plated conductive pattern 34 can be formed with a thickness in a typical range of 100 to 400 microinches.

After removal of the plated replica pattern, the master plate can be readily reused to form another like replica. No material reprocessing of the master plate is necessary in order to form additional replica patterns. For most purposes, it is only necessary to assure the cleanliness of the master conductive pattern 10 by rinsing the master plate in a suitable cleaning bath.

The invention is not to be limited by what has been particularly shown and described except as indicated in the appended claims.

What is claimed is:

1. A method of forming a precision conductive mesh pattern comprising the steps of:

forming a conductive master pattern on the surface of a non-conductive light transmissive substrate and a conductive border portion on said substrate surface in surrounding relation and electrical connection with said master pattern;

depositing a layer of photoresist material over said master pattern;

exposing said photoresist material from the side of said substrate opposite to said master pattern;

developing said exposed photoresist pattern to provide a pattern of unexposed photoresist material on and in exact registration with said master pattern;

depositing a layer of silicon monoxide over said master pattern and over the unexposed portions of said photoresist layer;

removing the unexposed portions of said photoresist layer and overlying portions of said silicon monoxide layer to form a silicon monoxide matrix within the interstices of said master pattern;

plating a conductive pattern onto said master pattern within the matrix defined by said silicon monoxide pattern and in exact conformance with said master pattern; and peeling said plated pattern from said master pattern.

2. The method according to claim 1 wherein said layer of silicon monoxide is deposited over said master pattern to a thickness substantially greater than the thickness of said photoresist layer.

3. The method according to claim 1 wherein said master pattern is formed with a plurality of electrical leads around the periphery of said conductive border portion to provide means for application of a uniform plating current distribution.

4. The method according to claim 1 including repeating the steps of said process without material reprocessing of said master pattern.

References Cited

UNITED STATES PATENTS

| | | | |
|---|---|---|---|
| 2,115,855 | 5/1938 | Holman | 204—11 |
| 2,225,734 | 12/1940 | Beebe | 204—11 |
| 2,598,318 | 5/1952 | Teal | 204—11 |
| 2,874,101 | 2/1959 | Larson | 204—11 |
| 3,102,847 | 9/1963 | Boulet et al. | 204—281 |

JOHN H. MACK, Primary Examiner

T. TUFARIELLO, Assistant Examiner

U.S. Cl. X.R.

204—281

UNITED STATES PATENT OFFICE

CERTIFICATE OF CORRECTION

Patent No. 3,703,450 Dated November 21, 1972

Inventor(s) Joseph J. Bakewell

It is certified that error appears in the above-identified patent and that said Letters Patent are hereby corrected as shown below:

Column 2, line 56, "view" should read --views--.

Column 2, line 67, "non-posed" should read --non-exposed--.

Column 3, line 35, after "master pattern" insert --10--.

Patentee's Error

Column 3, line 38, "dioxide" should read --monoxide--.

Signed and sealed this 14th day of January 1975.

(SEAL)
Attest:

McCOY M. GIBSON JR.
Attesting Officer

C. MARSHALL DANN
Commissioner of Patents